(12) United States Patent
Yano

(10) Patent No.: US 6,738,287 B2
(45) Date of Patent: May 18, 2004

(54) NONVOLATILE SEMICONDUCTOR MEMORY DEVICE HAVING NARROWER THRESHOLD DISTRIBUTION

(75) Inventor: Masaru Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/438,211

(22) Filed: May 15, 2003

(65) Prior Publication Data

US 2003/0218907 A1 Nov. 27, 2003

(30) Foreign Application Priority Data

May 23, 2002 (JP) ........................................ 2002-149329

(51) Int. Cl.[7] ............................................. G11C 16/04
(52) U.S. Cl. ............................ 365/185.03; 365/185.19; 365/185.22; 365/185.24
(58) Field of Search ................... 365/185.03, 185.19, 365/185.22, 185.24, 189.05, 189.12, 238.5, 230.08

(56) References Cited

U.S. PATENT DOCUMENTS

| 5,812,451 A | * | 9/1998 | Iwata ..................... 365/185.11 |
| 5,995,412 A | * | 11/1999 | Ohta ..................... 365/185.03 |
| 6,055,181 A | * | 4/2000 | Tanaka et al. ......... 365/185.03 |
| 6,525,960 B2 | * | 2/2003 | Yoshida et al. ........ 365/185.03 |
| 6,614,683 B1 | * | 9/2003 | Parker ................... 365/185.03 |

* cited by examiner

*Primary Examiner*—Son T. Dinh
(74) *Attorney, Agent, or Firm*—Arent Fox LLC

(57) ABSTRACT

A nonvolatile semiconductor memory device includes a memory core circuit which is nonvolatile and stores multi-values therein by setting different thresholds to memory cells, and a control circuit which controls data writing into the memory core circuit, wherein the control circuit programs first memory cells to be at one of the thresholds by setting the one of the thresholds not only to the first memory cells but also to second memory cells that are subsequently to be programmed to any one of the thresholds higher than the one of the thresholds, the control circuit successively performing programming in an ascending order of the thresholds.

9 Claims, 11 Drawing Sheets

NONVOLATILE SEMICONDUCTOR MEMORY DEVICE HAVING NARROWER THRESHOLD DISTRIBUTION

CROSS-REFERENCE TO RELATED APPLICATIONS

The present application is based upon and claims the benefit of priority from the prior Japanese Patent Application No. 2002-149329 filed on May 23, 2002, with the Japanese Patent Office, the entire contents of which are incorporated herein by reference.

BACKGROUND OF THE INVENTION

1. Field of the Invention

The present invention generally relates to nonvolatile semiconductor memory devices, and particularly relates to a method of and a circuit for writing data in a nonvolatile semiconductor memory device.

2. Description of the Related Art

When data are written in memory cells of nonvolatile semiconductor memory devices through program operations, charge is injected into the gates of memory cell transistors, resulting in increased thresholds. As a result, an electric current does not flow when a potential lower than these thresholds is applied to the gates. This achieves a data state that data "0" is written. In general, thresholds of memory cells in the erased state have variation. When programming is performed by applying predetermined write potentials to bring the thresholds above a verify level, thresholds of the memory cells after programming will also have some variation above the verify level.

There are nonvolatile semiconductor memory devices that represent multi-level values by setting memory cells to different thresholds. In such nonvolatile semiconductor memory devices, it is difficult to ensure reliable data recording if the distribution of thresholds is broad. This is because the gaps between adjacent data levels become narrower as the distribution broadens.

FIG. 1 is a flowchart showing a related-art operation that writes data in multi-level memory cells. FIG. 1 corresponds to a case in which the multi-values are comprised of 4 levels. FIG. 2 is an illustrative drawing showing bit distributions that are obtained after the completion of writing of memory cells according to the flowchart of FIG. 1. The horizontal axis represents the threshold of memory cell transistors, and the vertical axis corresponds to the number of bits (i.e., the number of memory cells). As shown in FIG. 2, there are four levels Erase, Level0, Level1, and Level2 after writing.

In order to write data at the four different levels, at step ST1, data is loaded to a page buffer. At a step ST2, data is stored in a write buffer WB with respect to memory cells that are subjected to Level2 writing. At step ST3, the memory cells that are subjected to writing are programmed by using potential pulses corresponding to Level2. At step ST4, a check is made as to whether the thresholds were shifted to Level2. At step ST5, a check is made as to whether all the bits subjected to writing have passed the check. If they have not yet passed, the procedure goes back to step ST3, followed by repeating the program and check operations. If all the bits subjected to writing have passed, the programming procedure for Level2 comes to an end, giving way to a next programming procedure.

At step ST6, data is stored in the write buffer WB with respect to memory cells that are subjected to Level0 and Level1 writing. At step ST7, the memory cells that are subjected to writing are programmed by using potential pulses corresponding to Level0. At step ST8, a check is made as to whether the thresholds were shifted to Level0. At step ST9, a check is made as to whether all the bits subjected to writing have passed the check. If they have not yet passed, the procedure goes back to step ST7, followed by repeating the program and check operations. If all the bits subjected to writing have passed, the programming procedure for Level0 comes to an end, giving way to a next programming procedure.

At step ST10, data is stored in the write buffer WB with respect to memory cells that are subjected to Level1 writing. At step ST11, the memory cells that are subjected to writing are programmed by using potential pulses corresponding to Level1. At step ST12, a check is made as to whether the thresholds were shifted to Level1. At step ST13, a check is made as to whether all the bits subjected to writing have passed the check. If they have not yet passed, the procedure goes back to step ST11, followed by repeating the program and check operations. If all the bits subjected to writing have passed, the programming procedure for Level1 comes to an end, which marks the end of the entire writing procedure.

When data writing is performed through programming, some cells are programmed earlier than other cells. That is, data writing is not yet completed with respect to these other cells at the time when the earlier cells are being programmed. There are thus a larger number of erased memory cells at such a time than when all the writing procedure is completed. When a currently selected memory cell is being verified, a large amount of an electric current flows into the ground potential through a large number of erased memory cells that are connected to the same word line as that of the currently selected memory cell. This results in a source potential of the memory cell being raised by the connect-line resistance, thereby letting the memory cell pass the verify check while its threshold still remains lower than a desired threshold.

In this manner, the state of memory cells connected to the same word line at the time of programming is different from the state of the memory cells at the time of data reading, and, thus, the raised level of the source potential is also different. This may cause an error in data reading.

In the writing procedure as shown in FIG. 1, the distributions of thresholds for Level0 through Level2 end up having their lower boundaries shifted to further left than the desired thresholds that are shown by hatches. This is caused by the same reasons as described above. Namely, passing the verify check at a threshold lower than a desired threshold causes the distributions of thresholds being broadened at their lower ends.

When programming for Level2 is performed in particular, data writing for Level0 and Level1 is not yet carried out, so that a quite large number of erased memory cells are in existence, compared to when the entire data writing is completed. As a result, the source potential of memory cells are significantly raised at the time of Level2 verify operation, compared to the time of data reading. This causes memory-cell thresholds to pass the verify check while they are lower than the desired threshold. The distribution of thresholds is thus broadened at its lower end.

When programming for Level0 is performed, data writing that raises thresholds to Level1 with respect to memory cells subjected to Level1 writing is not yet performed, so that a large number of erased memory cells are present, compared to when the entire data writing is completed. The distribution of thresholds is thus broadened at its lower end in the same manner as described above.

In the case of nonvolatile semiconductor memory devices that represent multi-values by setting the thresholds of memory cells to different threshold levels, a broadened threshold distribution as described above shortens an interval between adjacent data levels. This makes it difficult to achieve reliable data recording.

Accordingly, there is a need for a nonvolatile semiconductor memory device that achieves a sufficiently narrow distribution of thresholds after data writing.

SUMMARY OF THE INVENTION

It is a general object of the present invention to provide a nonvolatile semiconductor memory device that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory device particularly pointed out in the specification in such full, clear, concise, and exact terms as to enable a person having ordinary skill in the art to practice the invention.

To achieve these and other advantages in accordance with the purpose of the invention, the invention provides a nonvolatile semiconductor memory device, including a memory core circuit which is nonvolatile and stores multi-values therein by setting different thresholds to memory cells, and a control circuit which controls data writing into the memory core circuit, wherein the control circuit programs first memory cells to be at one of the thresholds by setting the one of the thresholds not only to the first memory cells but also to second memory cells that are subsequently to be programmed to any one of the thresholds higher than the one of the thresholds, the control circuit successively performing programming in an ascending order of the thresholds.

In the nonvolatile semiconductor memory device as described above, when program and verify operations are carried out in respect of a given threshold, writing in respect of any thresholds lower than the given threshold has already been completed. The memory cells are therefore placed in the same or similar program conditions as the memory cells observed at the time of data reading that will be performed after data writing. As a result, an increase in the source potential of the memory cells becomes substantially the same as an increase observed at the time of data reading, so that thresholds are set substantially equal to a desired threshold. The distribution of thresholds is not broadened at its lower end as was in the related art, and a sufficient interval between adjacent thresholds is secured, thereby achieving reliable data recording.

According to another aspect of the present invention, a nonvolatile semiconductor memory device includes a memory core circuit which includes nonvolatile memory cells, and a control circuit which controls data writing into the memory core circuit, wherein, in order to program given memory cells to be at a given threshold, the control circuit first programs the given memory cells by use of predetermined programming pulses and by use of a threshold lower than the given threshold for a verify purpose, and then programs the given memory cells by use of programming pulses weaker than the predetermined programming pulses and by use of the given threshold for a verify purpose.

In the nonvolatile semiconductor memory device as described above, the distribution of memory cells subjected to data writing has its upper end first defined through a verify check that uses a reference level lower than the given threshold. The lower end of the distribution is then shifted up by using relatively low potential pulses for the programming purpose and by performing a verify check that uses a reference level equal to the given threshold. Because of this procedure, the distribution ends up being narrower, compared to when a verify check is made throughout the procedure by using only the reference level equal to the given threshold.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
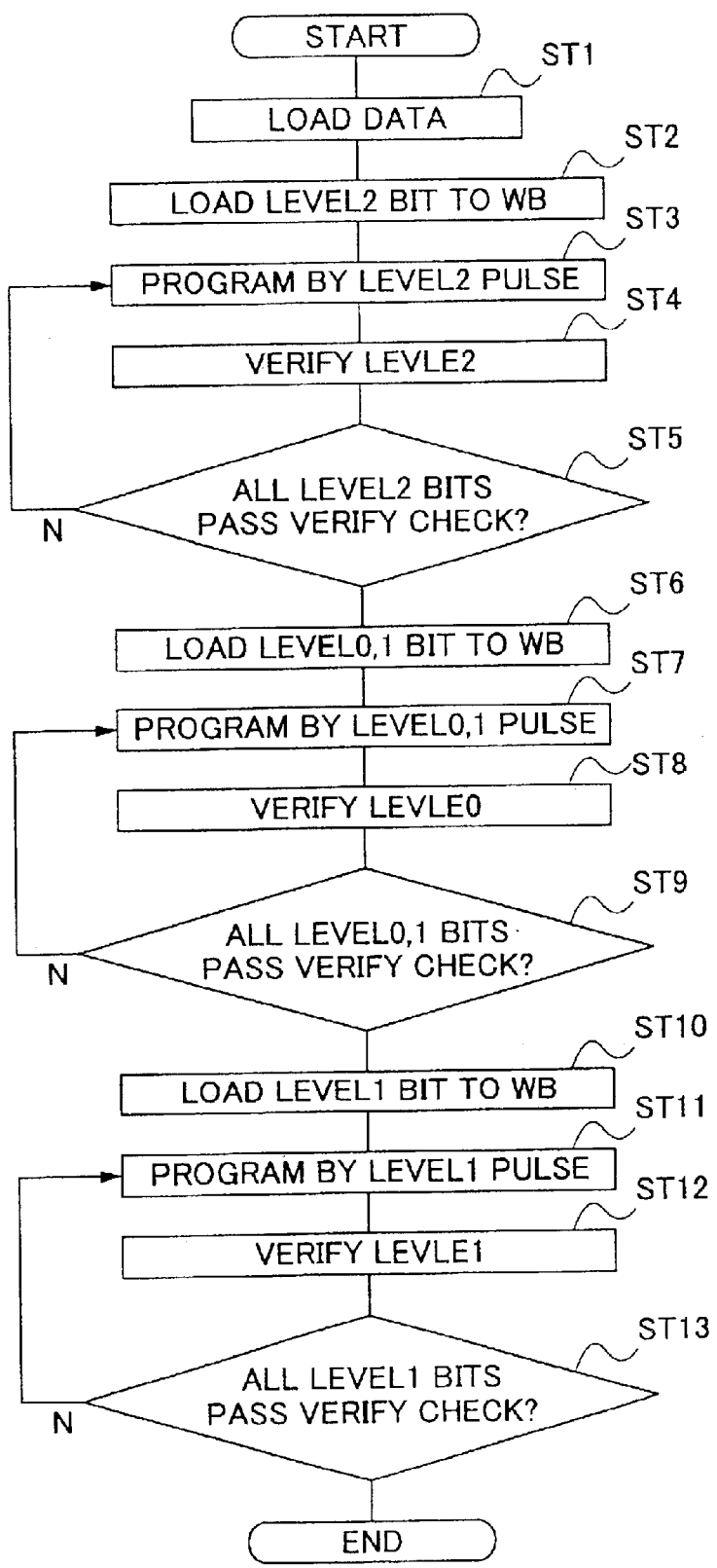
FIG. 1 is a flowchart showing a related-art operation that writes data in multi-level memory cells.
Figure 2:
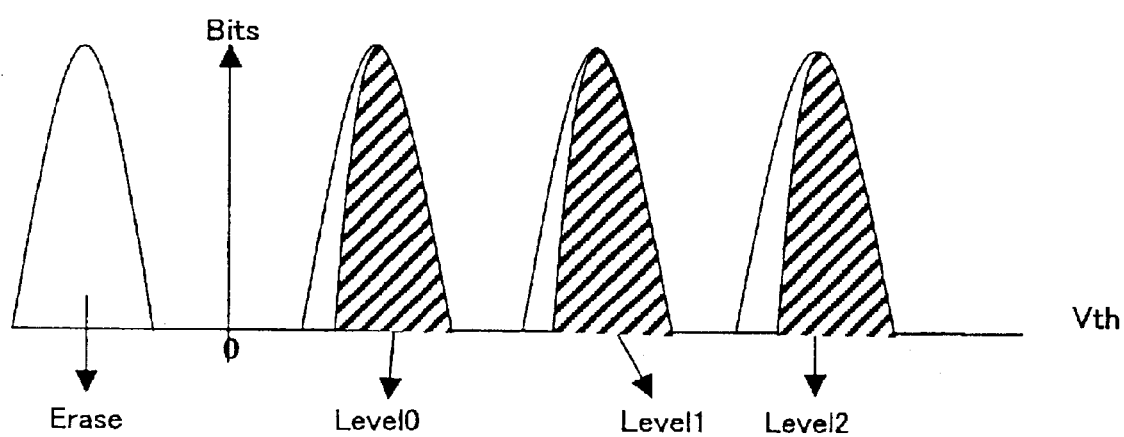
FIG. 2 is an illustrative drawing showing bit distributions that are obtained after the completion of writing of memory cells according to the flowchart of FIG. 1.
Figure 3:
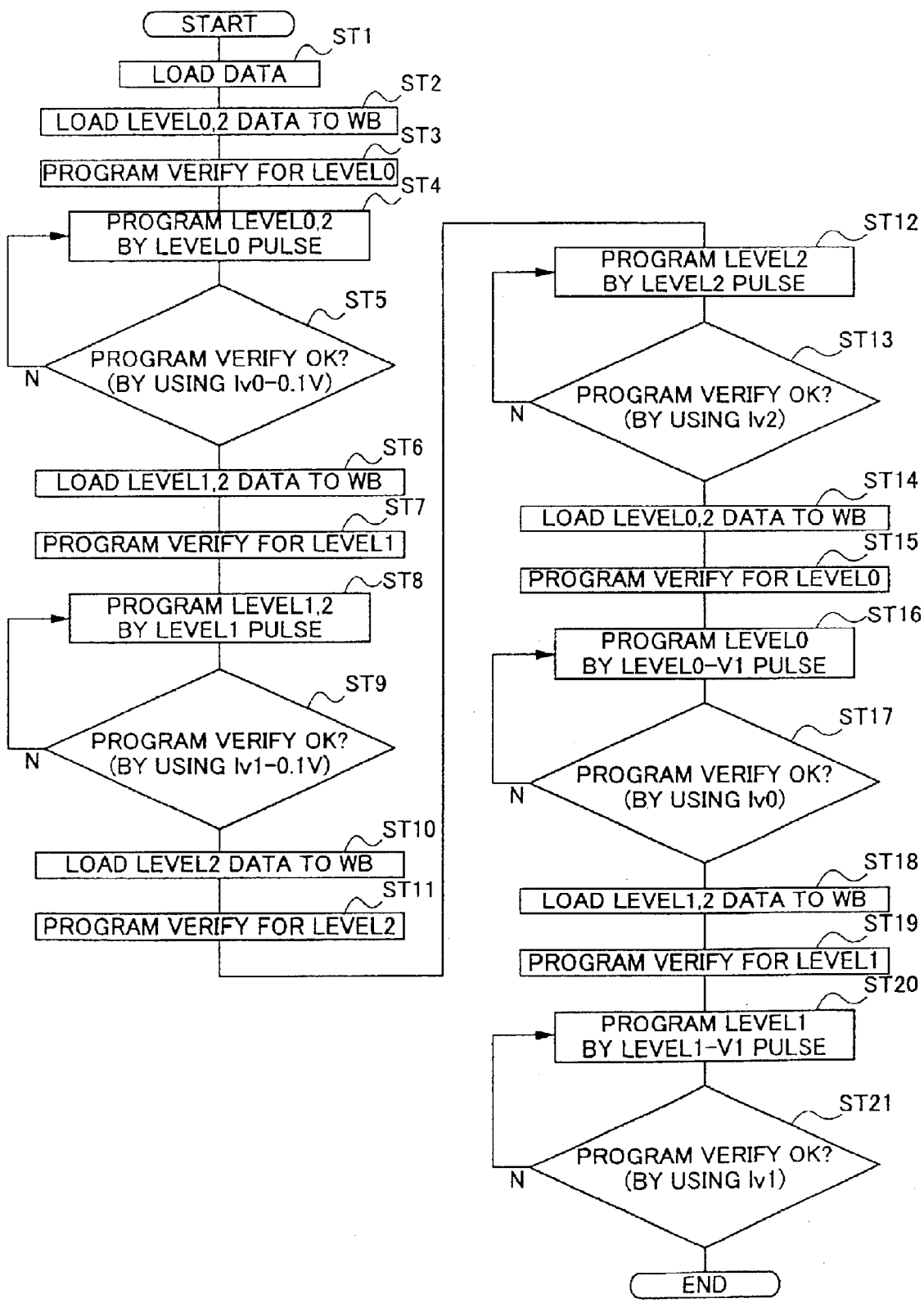
FIG. 3 is a flowchart of data writing with respect to multi-value memory cells according to the present invention.

FIG. 3 is a flowchart of data writing with respect to multi-value memory cells according to the present invention. FIG. 3 corresponds to a case in which the multi-values are comprised of 4 levels. FIGS. 4A through 4E are illustrative drawings showing bit distributions that are obtained after the completion of writing of memory cells according to the flowchart of FIG. 3.

In order to write data at the four different levels, at step ST1, data is loaded to a page buffer. At a step ST2, data is stored in a write buffer WB with respect to memory cells that are subjected to Level0 and Level2 writing. At step ST3, a program verify check is performed with respect to Level0. At step ST4, the memory cells that are subjected to Level0 and Level2 writing are programmed by using potential pulses corresponding to Level0.

At step ST5, a check is made as to whether all the bits subjected to writing have passed the verify check. Here, a reference level used for the verify check is lv0 minus 0.1 V where lv0 is a minimum threshold potential that is no more than necessary for Level0. If all the bits subjected to writing have not yet passed, the procedure goes back to step ST4, followed by repeating the program and check operations. If all the bits subjected to writing have passed, the programming procedure for Level0 tentatively comes to an end.

Figure 4A:
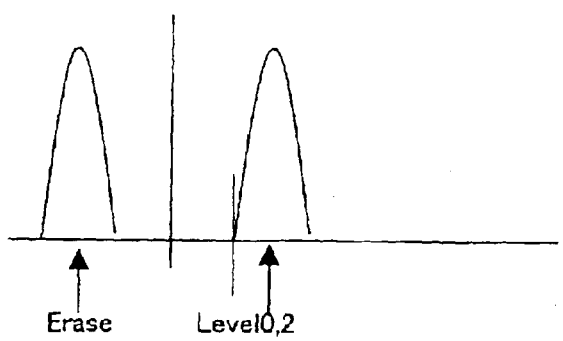
FIGS. 4A through 4E are illustrative drawings showing bit distributions that are obtained after the completion of writing of memory cells according to the flowchart of FIG. 3.

At this stage, the memory cells that are subjected to Level0 and Level2 writing are programmed so as to be at the Level0 level as shown in FIG. 4A. In this case, however, the distribution of memory cell thresholds is shifted to the left by 0.1 V relative to the minimum threshold lv0 that is no more than necessary for Level0.

At step ST6, data is stored in the write buffer WB with respect to memory cells that are subjected to Level1 and Level2 writing. At step ST7, a program verify check is performed with respect to Level1. At step ST8, the memory cells that are subjected to Level1 and Level2 writing are programmed by using potential pulses corresponding to Level1.

At step ST9, a check is made as to whether all the bits subjected to writing have passed the verify check. Here, a reference level used for the verify check is lv1 minus 0.1 V where lv1 is a minimum threshold potential that is no more than necessary for Level1. If all the bits subjected to writing have not yet passed, the procedure goes back to step ST8, followed by repeating the program and check operations. If all the bits subjected to writing have passed, the programming procedure for Level1 tentatively comes to an end.

Figure 4B:
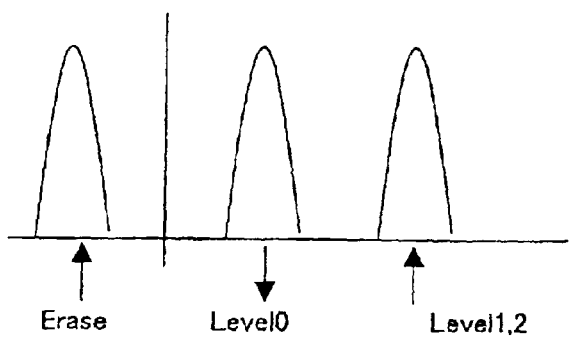

At this stage, the memory cells that are subjected to Level0 writing are programmed so as to be at the Level0 level, and the memory cells that are subjected to Level1 and Level2 writing are programmed so as to be at the Level1 level, as shown in FIG. 4B. In this case, however, the distribution of memory cell thresholds concerning Level0 is shifted to the left by 0.1 V relative to the minimum threshold lv0 that is no more than necessary for Level0, and the distribution of memory cell thresholds concerning Level1 is shifted to the left by 0.1 V relative to the minimum threshold lv1 that is no more than necessary for Level1.

At step ST10, data is stored in the write buffer WB with respect to memory cells that are subjected to Level2 writing. At step ST11, a program verify check is performed with respect to Level2. At step ST12, the memory cells that are subjected to Level2 writing are programmed by using potential pulses corresponding to Level2.

At step ST13, a check is made as to whether all the bits subjected to writing have passed the verify check. Here, a reference level used for the verify check is a minimum threshold potential lv2 that is no more than necessary for Level2. If all the bits subjected to writing have not yet passed, the procedure goes back to step ST12, followed by repeating the program and check operations. If all the bits subjected to writing have passed, the programming procedure for Level2 comes to an end.

Figure 4C:
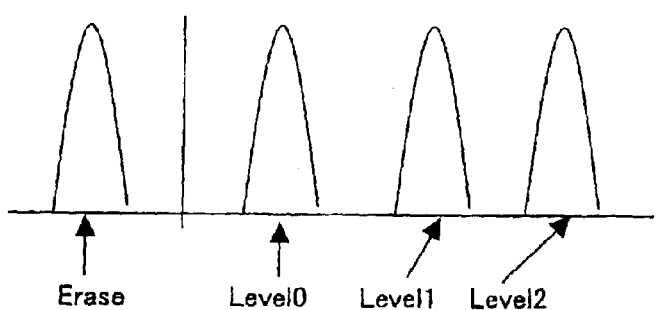

At this stage, the memory cells that are subjected to Level0 writing are programmed so as to be at the Level0 level, the memory cells that are subjected to Level1 writing being programmed so as to be at the Level1 level, and the memory cells that are subjected to Level2 writing being programmed so as to be at the Level2 level, as shown in FIG. 4C. In this case, the distribution of memory cell thresholds concerning Level0 is shifted to the left by 0.1 V relative to the minimum threshold lv0 that is no more than necessary for Level0, and the distribution of memory cell thresholds concerning Level1 is shifted to the left by 0.1 V relative to the minimum threshold lv1 that is no more than necessary for Level1. Further, the distribution of memory cell thresholds concerning Level2 is demarcated by the minimum threshold lv2.

At step ST14, data is stored in the write buffer WB with respect to memory cells that are subjected to Level0 and Level2 writing. At step ST15, a program verify check is performed with respect to Level0. At step ST16, the memory cells that are subjected to Level0 writing are programmed by using potential pulses corresponding to Level0–V1(=0.1 V).

At step ST17, a check is made as to whether all the bits subjected to writing have passed the verify check. Here, a reference level used for the verify check is the minimum threshold potential lv0 that is no more than necessary for Level0. If all the bits subjected to writing have not yet passed, the procedure goes back to step ST16, followed by repeating the program and check operations. If all the bits subjected to writing have passed, the programming procedure for Level0 comes to an end.

Figure 4D:
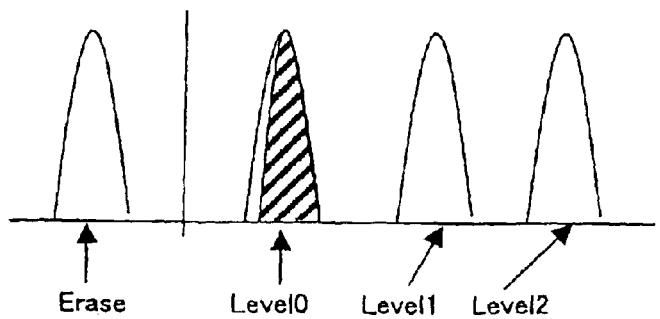

At this stage, the distribution of memory cells that are subjected to Level0 writing has the thresholds of memory cells raised, as shown in FIG. 4D by hatches, at the portion close to the left end of the distribution. Since the program pulses are set at Level0–V1, the memory cells having the raised thresholds do not exceed the right-hand-side end of the original distribution. As a result, the distribution as shown by the hatches has a narrower spread than the original distribution as shown in FIG. 4C.

At step ST18, data is stored in the write buffer WB with respect to memory cells that are subjected to Level1 and Level2 writing. At step ST19, a program verify check is performed with respect to Level1. At step ST20, the memory cells that are subjected to Level1 writing are programmed by using potential pulses corresponding to Level1–V1(=0.1 V).

At step ST21, a check is made as to whether all the bits subjected to writing have passed the verify check. Here, a reference level used for the verify check is the minimum threshold potential lv1 that is no more than necessary for Level1. If all the bits subjected to writing have not yet passed, the procedure goes back to step ST20, followed by repeating the program and check operations. If all the bits subjected to writing have passed, the programming procedure for Level1 comes to an end.

Figure 4E:
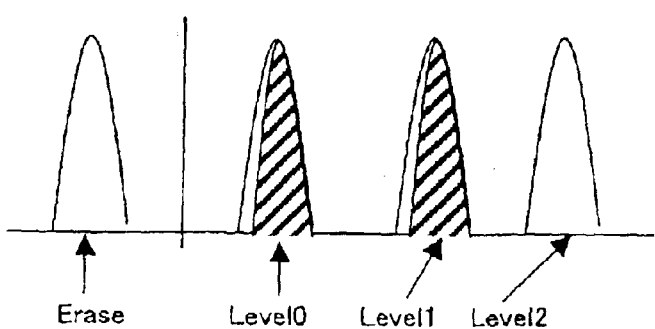

At this stage, the distribution of memory cells that are subjected to Level1 writing has the thresholds of memory cells raised, as shown in FIG. 4E by hatches, at the portion close to the left end of the distribution. Since the program pulses are set at Level1–V1, the memory cells having the raised thresholds do not exceed the right-hand-side end of the original distribution. As a result, the distribution as shown by the hatches has a narrower spread than the original distribution as shown in FIG. 4C.

With this, the entire procedure comes to an end.

Through the writing procedure as described above, memory cells that are programmed to multi-values as shown in FIG. 4E are obtained. As described above, each of the distribution of memory cells that are subjected to Level0 writing and the distribution of memory cells that are subjected to Level1 writing is first verified by using the reference level that is 0.1-V lower than the predetermined threshold, and is then programmed by pulses having a relatively lower potential, with a verify check being performed by using the predetermined threshold as a reference level. This ensures that the resulting distribution has a narrower spread than a distribution that would be obtained in a straightforward manner by using only the predetermined threshold as a reference level.

When program and verify operations are carried out in respect of the memory cells subjected to Level2 writing, the writing of Level0 and level1 memory cells has already been completed. The Level0 and Level1 memory cells are therefore placed in the same or similar program conditions as the memory cells observed at the time of data reading that will be performed after data writing. As a result, an increase in the source potential of the memory cells becomes substantially the same as an increase observed at the time of data reading, so that thresholds are set substantially equal to a desired threshold. The distribution of thresholds is not broadened at its lower end as was in the related art, and a sufficient interval between Level1 and Level2 is secured, thereby achieving reliable data recording.

Figure 5:
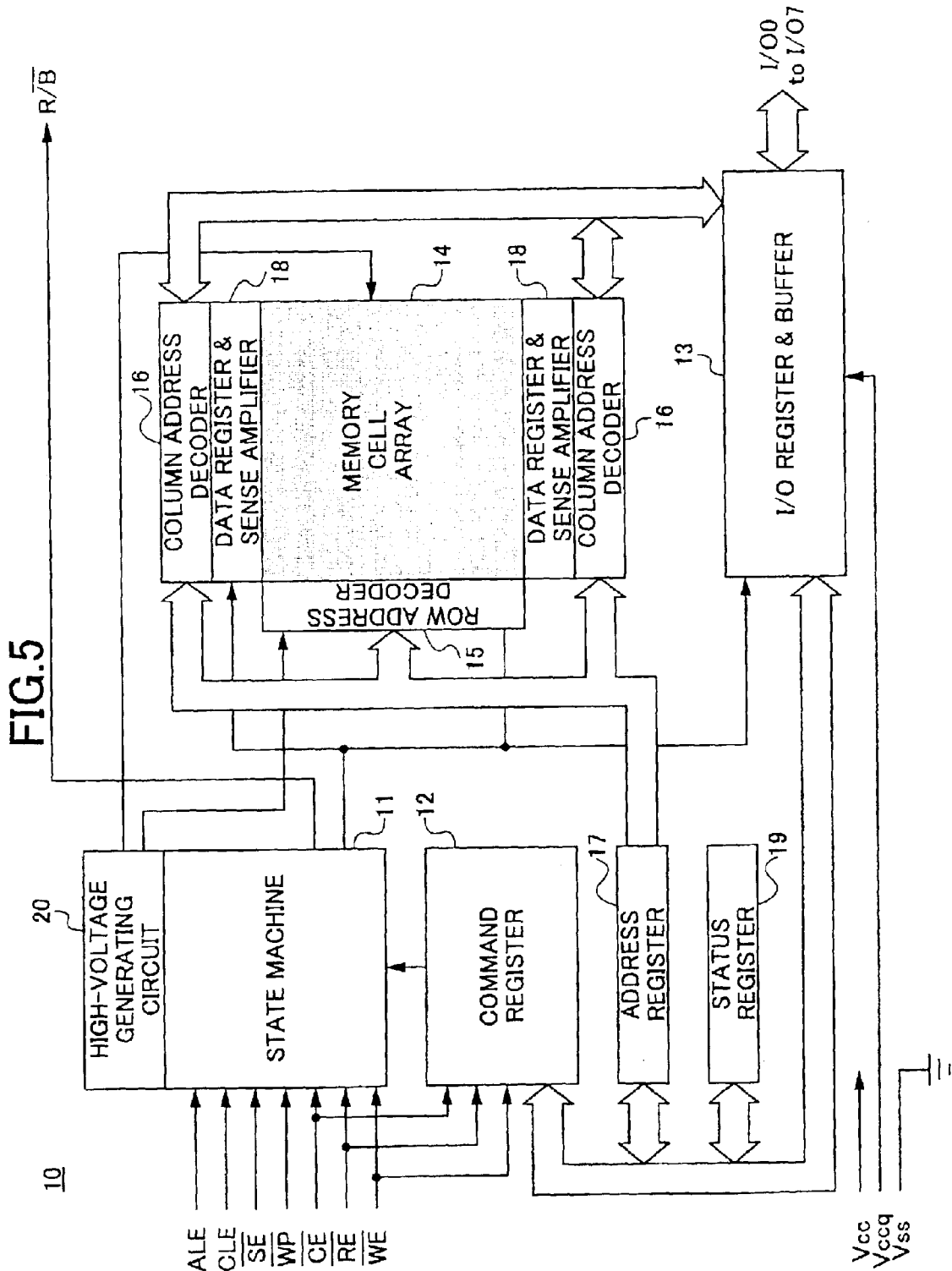
FIG. 5 is a block diagram showing a schematic configuration of a nonvolatile semiconductor memory device according to the present invention.

FIG. 5 is a block diagram showing a schematic configuration of a nonvolatile semiconductor memory device according to the present invention.

A nonvolatile semiconductor memory device 10 of FIG. 5 includes a state machine 11, a command register 12, an I/O register & buffer 13, a memory cell array 14, a row address decoder 15, a column address decoder 16, an address register 17, a data register & sense amplifier 18, a status register 19, and a high-voltage generating circuit 20.

The state machine 11 receives control signals such as an address latch-enable signal ALE, a command latch-enable signal CLE, a spare-area-enable signal /SE, a write-protection signal /WP, a chip-enable signal /CE, a read-enable signal /RE, and a write-enable signal /WE from the exterior, and further receives commands from the command register 12. The state machine 11 operates based on these control signals and commands, thereby controlling the operation of each part of the nonvolatile semiconductor memory device 10.

The command register 12 receives the chip-enable signal /CE, the read-enable signal /RE and the write-enable signal /WE as control signals, and further receives a command, an address, and input/output data supplied from the exterior through the I/O register & buffer 13, followed by storing the received command in an internal register. The I/O register & buffer 13 receives the command, the address, and the input/output data from the exterior, and supplies them to the command register 12, the address register 17, and the status register 19.

The state machine 11 controls the memory cell array 14, the row address decoder 15, the column address decoder 16, etc., in order to read data from the memory cell array 14 at an address indicated by the address register 17. Further, the state machine 11 controls the memory cell array 14, the row address decoder 15, the column address decoder 16, etc., in order to write data in the memory cell array 14 at a write address thereof. Moreover, the state machine 11 controls the memory cell array 14, the row address decoder 15, the column address decoder 16, etc., through the address register 17, in order to erase an indicated area of the memory cell array 14 by the erasure of a preset area unit at a time.

The memory cell array 14 includes an array of memory cell transistors, word lines, bit lines, etc., and store data in each memory cell transistor. At the time of data reading, data are read from memory cells specified by the activated word line, and are supplied to the bit lines. At the time of programming and erasing, word lines and bit lines are set to potentials suitable for respective operations, thereby injecting or removing electric charge into or from memory cells.

The data register & sense amplifier 18 operates under the control of the state machine 11, and compares a reference current with a data current that is supplied form the memory cell array 14 as indicated by the row address decoder 15 and the column address decoder 16. This provides the sensing of data as to whether it is 0 or 1. The sensing of data is performed by sense amplifier circuitry provided in the data register & sense amplifier 18, and the sensed data is supplied to the I/O register & buffer 13 as read data.

Further, a verify check for the program operation and the erase operation is performed by comparing a reference current for the program verify or the erase verify with a data current supplied from the memory cell array 14 as indicated by the row address decoder 15 and the column address decoder 16. In the program operation, write data is stored in the register of the data register & sense amplifier 18, and, then, the word lines and bit lines of the memory cell array 14 are set to proper potentials so as to inject electric charge into the memory cells.

The status register 19 is a register, which stores status information about the operation of the nonvolatile semiconductor memory device 10. By reading the contents of the register through the I/O register & buffer 13, it can be known whether the device is in a ready state, set in a write-protection mode, or engaged in a program/erase operation. The high-voltage generating circuit 20 serves to generate high potentials used for program operations and erase operations.

Data writing according to the present invention as described in connection with FIG. 3 and FIG. 4 is carried out by driving the data register & sense amplifier 18, the memory cell array 14, and its peripheral circuits under the control of the state machine 11.

Figure 6:
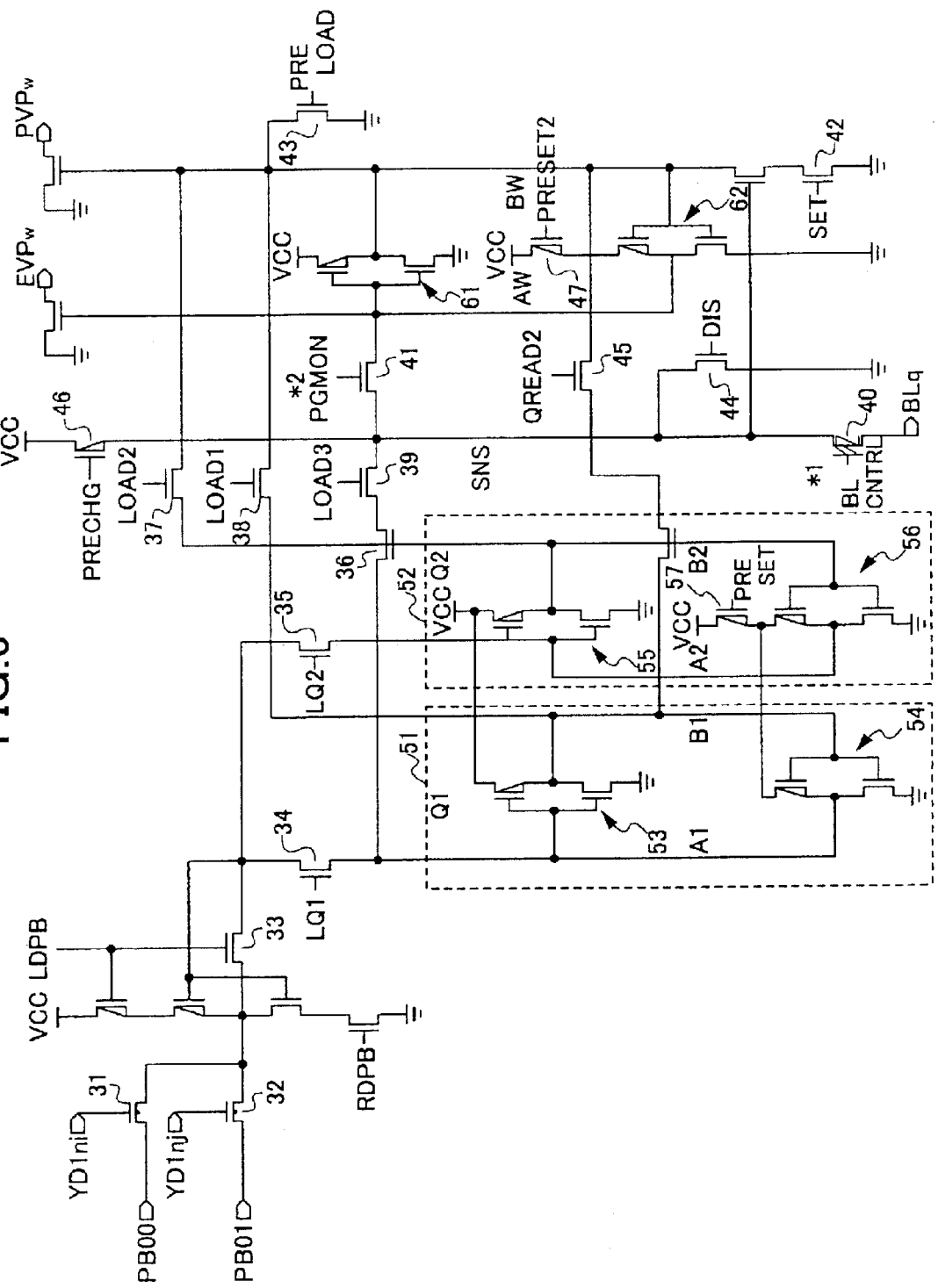
FIG. 6 is a circuit diagram showing an example of the construction of a page buffer and a write buffer.

FIG. 6 is a circuit diagram showing an example of the construction of a page buffer and a write buffer.

The circuit of FIG. 6 mainly includes NMOS transistors 31 through 45, PMOS transistors 46 and 47, page-buffer latches 51 and 52, and inverters 61 and 62, each of which is comprised of an NMOS transistor and a PMOS transistor. The page-buffer latch 51 includes inverters 53 and 54, each of which is comprised of an NMOS transistor and a PMOS transistor, and has the output thereof supplied as an input into the other, thereby forming a latch. The page-buffer latch 52 includes inverters 55 and 56, each of which is comprised of an NMOS transistor and a PMOS transistor, and has the output thereof supplied as an input into the other, thereby forming a latch. The page-buffer latch 52 further includes a PMOS transistor 57. The inverters 61 and 62 have the outputs thereof supplied as inputs into each other, thereby forming a latch, which serves as the write buffer WB.

Figure 7:
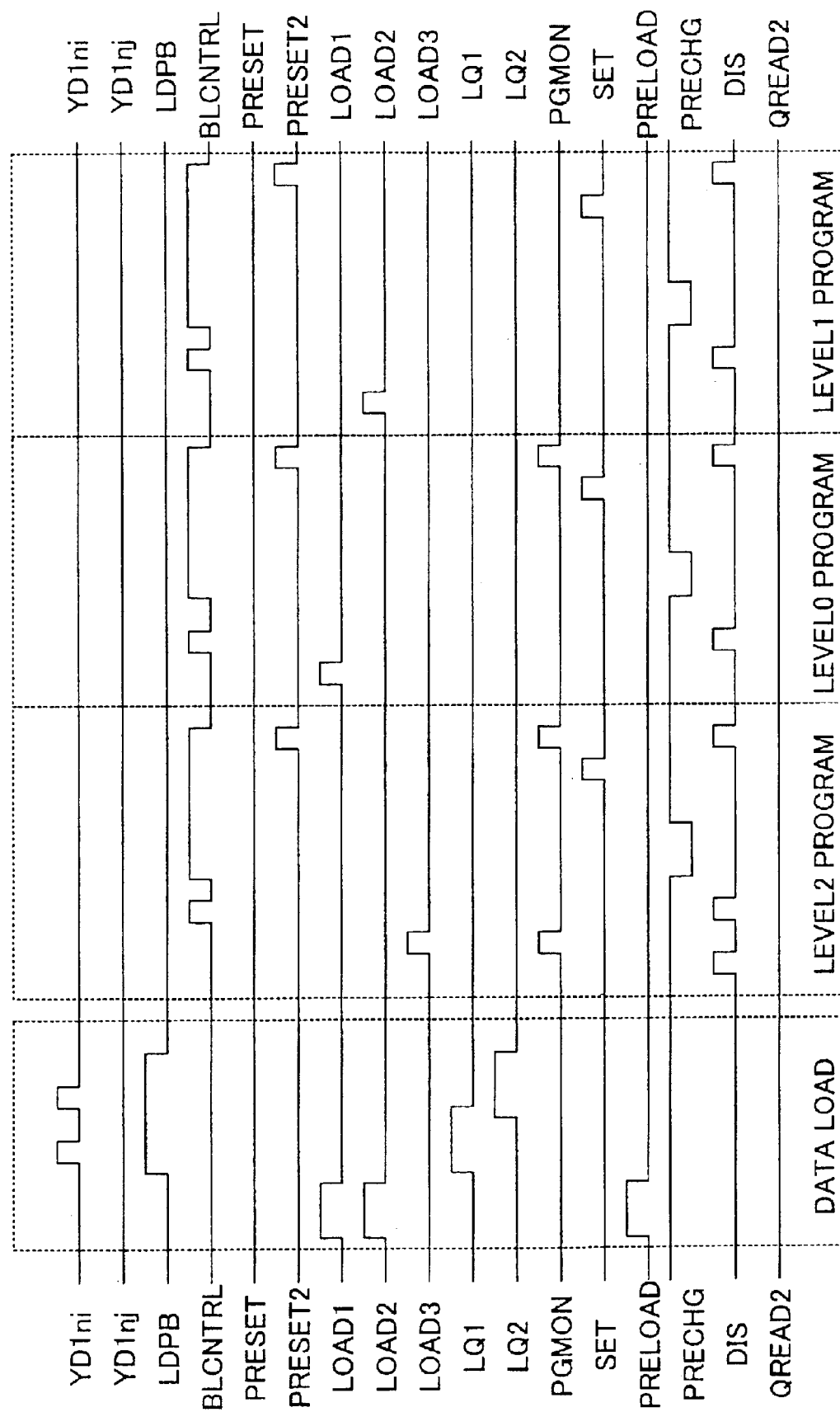
FIG. 7 is a timing chart showing the operation of data writing by the circuit of FIG. 6.

FIG. 7 is a timing chart showing the operation of data writing by the circuit of FIG. 6.

A data-load operation will be described first. LOAD1, LOAD2, and PRELOAD are set to HIGH, thereby making the NMOS transistors 37, 38, and 43 conductive. As a result, B1 of the page-buffer latch 51 is brought down to the ground level, and B2 of the page-buffer latch 52 is also brought down to the ground level, so that the page-buffer latches 51 and 52 are reset.

LDPB is then set to HIGH to make the NMOS transistor 33 conductive, and YD1ni is set to HIGH to make the NMOS transistor 31 conductive. In addition, LQ1 is set to HIGH to turn on the NMOS transistor 34, thereby storing the first data appearing at a node PB00 in the page-buffer latch 51. YD1ni is changed again to HIGH to turn on the NMOS transistor 31, and LQ2 is set to HIGH to turn on the NMOS transistor 35, thereby storing the second data appearing at the node PB00 in the page-buffer latch 52.

In this manner, the storing of two bit data is completed with respect to the page-buffer latches 51 and 52. This two bit data represents different data levels by the combinations of (A1, A2) as follows.

| (A1, A2) | LEVEL |
|---|---|
| (0, 0) | Level2 |
| (1, 0) | Level1 |
| (0, 1) | Level0 |
| (1, 1) | Erase |

In the following, data writing with respect to Level2 will be described. DIS is changed to HIGH to make the NMOS transistor 44 conductive. This brings down a signal line SNS to the ground. LOAD3 and PGMON are then changed to HIGH, thereby turning on the NMOS transistors 39 and 41. If (A1, A2) of the page-buffer latches 51 and 52 is (0, 0), the NMOS transistor 36 becomes conductive, so that "0" of A1 is stored in the write buffer WB. That is, a signal line AW becomes LOW. If (A1, A2) of the page-buffer latches 51 and 52 is not (0, 0), the signal line AW of the write buffer WB does not becomes LOW. In this manner, the write buffer WB is set to indicate programming only with respect to the memory cells that are subjected to Level2 writing.

The setting of the signal line AW of the write buffer WB to LOW corresponds to the performing of a program operation with respect to the memory cell. Namely, BL_CNTRL is changed to HIGH to turn on the NMOS transistor 40, and PGMON is changed to HIGH to turn on the NMOS transistor 41, thereby supplying the data stored in the write buffer WB (i.e., the potential at the signal line AW) to a bit line BLq. In this manner, the LOW potential is supplied to the bit line BLq, and a program operation of the corresponding memory cell is performed.

In what follows, data writing with respect to Level0 will be described. In this case, LOAD1 is turned to HIGH to make the NMOS transistor 38 conductive. If A1 of the page-buffer latch 51 is 0, B1 that is an inverse of A1 and thus "1" is stored in the BW side of the write buffer WB through the NMOS transistor 38. That is, the signal line AW of the write buffer WB becomes LOW. In this case, the signal line AW of the write buffer WB becomes LOW regardless of the value of the page-buffer latch 52 as long as A1 of the page-buffer latch 51 is "0". Namely, the write buffer WB is set to indicate programming with respect to the memory cells that are subjected to Level0 and Level2 writing.

In order to perform programming on the relevant memory cells, BL_CNTRL is changed to HIGH to turn on the NMOS transistor 40, and PGMON is changed to HIGH to turn on the NMOS transistor 41, thereby supplying the LOW potential of the signal line AW of the write buffer WB to the bit line BLq.

In what follows, data writing with respect to Level1 will be described. In this case, LOAD2 is turned to HIGH to make the NMOS transistor 37 conductive. If A2 of the page-buffer latch 52 is 0, B2 that is an inverse of A2 and thus "1" is stored in the BW side of the write buffer WB through the NMOS transistor 37. That is, the signal line AW of the write buffer WB becomes LOW. In this case, the signal line AW of the write buffer WB becomes LOW regardless of the value of the page-buffer latch 51 as long as A2 of the page-buffer latch 52 is "0". Namely, the write buffer WB is set to indicate programming with respect to the memory cells that are subjected to Level1 and Level2 writing.

In order to perform programming on the relevant memory cells, BL_CNTRL is changed to HIGH to turn on the NMOS transistor 40, and PGMON is changed to HIGH to turn on the NMOS transistor 41, thereby supplying the LOW potential of the signal line AW of the write buffer WB to the bit line BLq.

In this manner, use of the circuit of FIG. 6 makes it possible to perform consecutive program operations including the program operation by loading the Level0 and Level2 data to the write buffer WB as shown in step ST2 or step ST14 of FIG. 3, the program operation by loading the Loevel1 and Level2 data to the write buffer WB as shown in step ST6 or step ST18 of FIG. 3, and the program operation by loading only the Level2 data to the write buffer WB as shown in step ST10 of FIG. 3. In the circuit of FIG. 6, the data of each memory cell stored in the page-buffer latches 51 and 52 remains even after the data of the write buffer WB is reset following a program operation. Accordingly, it is possible to transfer data from the page-buffer latches 51 and 52 to the write buffer WB even if the data has once been used in programming, which allows the procedure of the flow-chart of FIG. 3 to be properly carried out.

Figure 8:
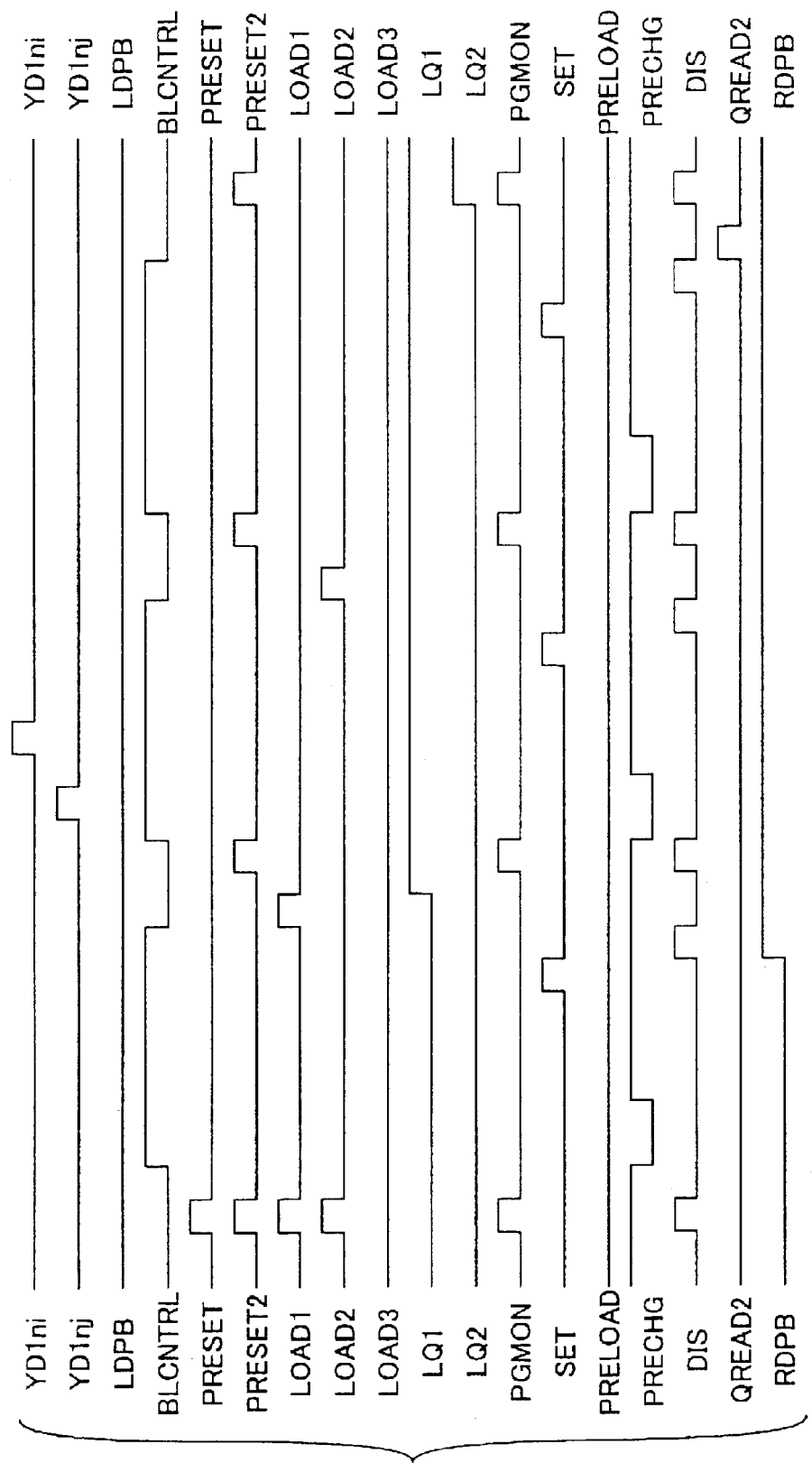
FIG. 8 is a timing chart showing an example of data reading performed by the circuit of FIG. 6.

FIG. 8 is a timing chart showing an example of data reading performed by the circuit of FIG. 6.

Controlling each signal according to the procedure shown in FIG. 8 achieves the reading of data from memory cells. In FIG. 8, sensed data are successively stored in the page-buffer latches 51 and 52 by successively reading data from memory cells through bit lines. The data stored in the page-buffer latches 51 and 52 in this manner represents 4-bit data levels, thereby achieving a proper read operation.

Figure 9:
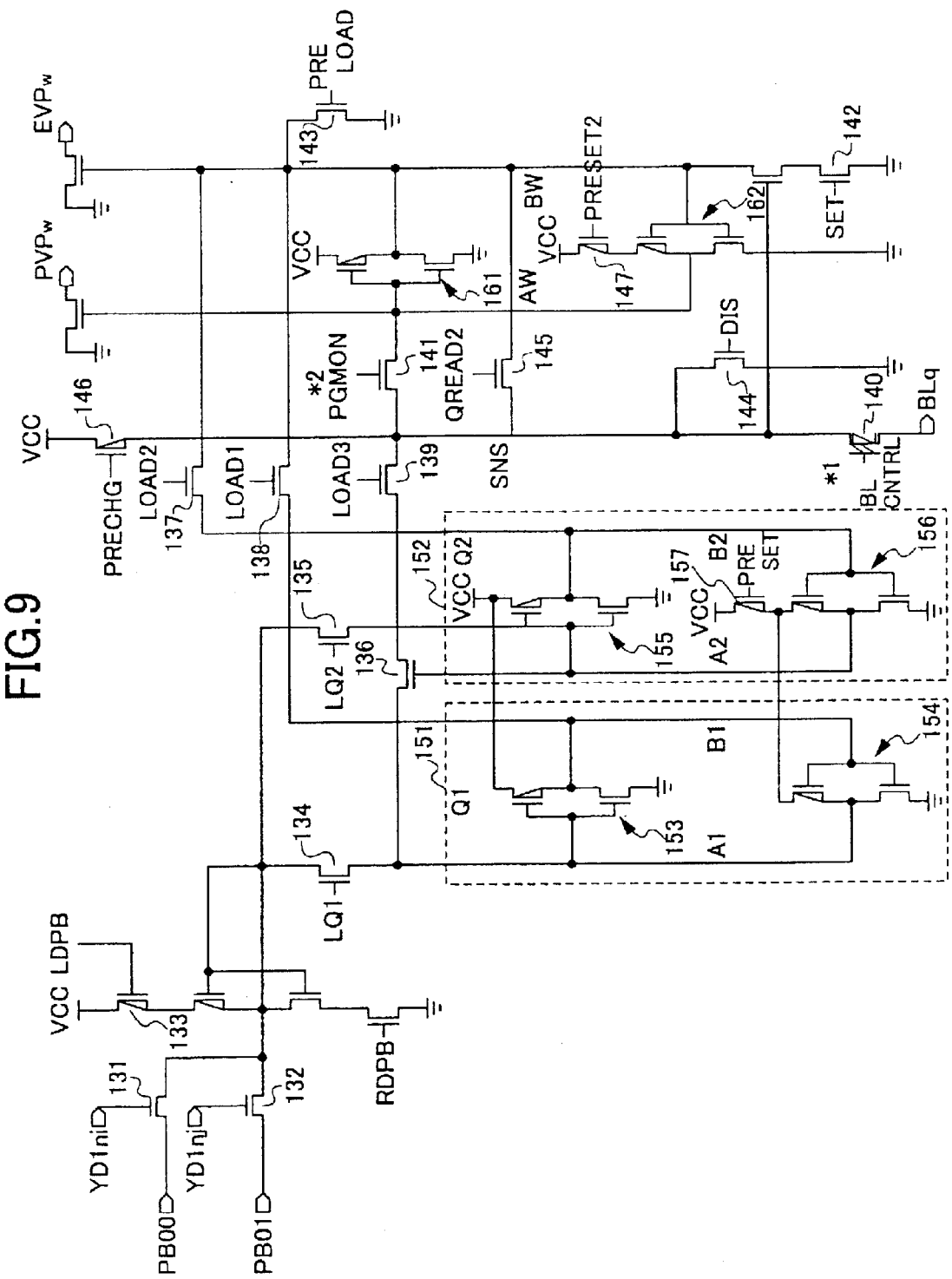
FIG. 9 is a circuit diagram showing another example of the construction of a page buffer and a write buffer.

FIG. 9 is a circuit diagram showing another example of the construction of a page buffer and a write buffer.

The circuit of FIG. 9 mainly includes NMOS transistors 131 through 145, PMOS transistors 146 and 147, page-buffer latches 151 and 152, and inverters 161 and 162, each of which is comprised of an NMOS transistor and a PMOS transistor. The page-buffer latch 151 includes inverters 153 and 154, each of which is comprised of an NMOS transistor and a PMOS transistor, and has the output thereof supplied as an input into the other, thereby forming a latch. The page-buffer latch 152 includes inverters 155 and 156, each of which is comprised of an NMOS transistor and a PMOS transistor, and has the output thereof supplied as an input into the other, thereby forming a latch. The page-buffer latch 152 further includes a PMOS transistor 157. The inverters 161 and 162 have the outputs thereof supplied as inputs into each other, thereby forming a latch, which serves as the write buffer WB.

In the circuit of FIG. 6, data stored in the page-buffer latches 51 and 52 represents 4 data levels in a manner corresponding to ordinary binary representation. In the circuit of FIG. 9, on the other hand, data levels are represented by gray codes (i.e., the distance between adjacent levels is always "1") as follows.

| (A1, A2) | LEVEL |
|---|---|
| (0, 1) | Level2 |
| (0, 0) | Level1 |
| (1, 0) | Level0 |
| (1, 1) | Erase |

Figure 10:
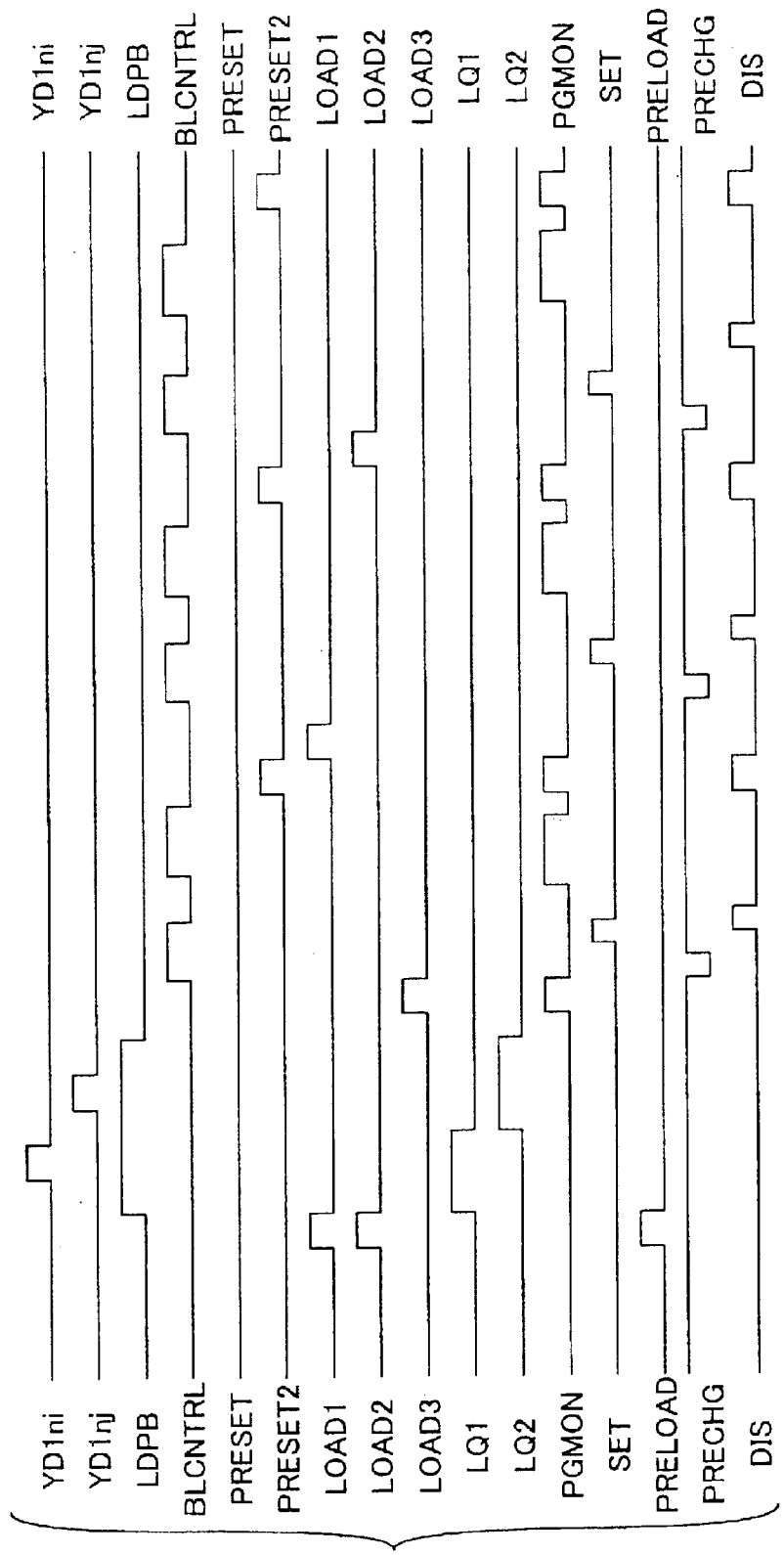
FIG. 10 is a timing chart showing the operation of data writing performed by the circuit of FIG. 9.

FIG. 10 is a timing chart showing the operation of data writing performed by the circuit of FIG. 9.

A description will be first given of a data loading operation. LOAD1, LOAD2, and PRELOAD are set to HIGH, thereby making the NMOS transistors 137, 138, and 143 conductive. As a result, B1 of the page-buffer latch 151 is brought down to the ground level, and B2 of the page-buffer latch 152 is also brought down to the ground level, so that the page-buffer latches 151 and 152 are reset. LDPB is then set to HIGH to make the NMOS transistor 133 nonconductive, and YD1ni is set to HIGH to make the NMOS transistor 131 conductive. In addition, LQ1 is set to HIGH to turn on the NMOS transistor 134, thereby storing the first data appearing at a node PB00 in the page-buffer latch 151. YD1ni is changed again to HIGH to turn on the NMOS transistor 131, and LQ2 is set to HIGH to turn on the NMOS transistor 135, thereby storing the second data appearing at the node PB00 in the page-buffer latch 152.

In this manner, the storing of two bit data is completed with respect to the page-buffer latches 151 and 152. This two bit data is represented by gray codes as described above.

In the following, data writing with respect to Level2 will be described. LOAD3 and PGMON are changed to HIGH, thereby turning on the NMOS transistors 139 and 141. If (A1, A2) of the page-buffer latches 151 and 152 is (0, 1), the NMOS transistor 136 becomes conductive, so that "0" of A1 is stored in the write buffer WB. That is, a signal line AW becomes LOW. If (A1, A2) of the page-buffer latches 151 and 152 is not (0, 1), the signal line AW of the write buffer WB does not becomes LOW. In this manner, the write buffer WB is set to indicate programming only with respect to the memory cells that are subjected to Level2 writing.

In order to perform a program operation with respect to the relevant memory cell, BL_CNTRL is changed to HIGH to turn on the NMOS transistor 140, and PGMON is changed to HIGH to turn on the NMOS transistor 141, thereby supplying the LOW potential of the signal line AW of the write buffer WB to a bit line BLq. A program operation of the corresponding memory cell is thus performed.

In what follows, data writing with respect to Level0 will be described. In this case, LOAD1 is turned to HIGH to make the NMOS transistor 137 conductive. If A2 of the page-buffer latch 152 is 0, B2 that is an inverse of A2 and thus "1" is stored in the BW side of the write buffer WB through the NMOS transistor 137. That is, the signal line AW of the write buffer WB becomes LOW. In this case, the signal line AW of the write buffer WB becomes LOW regardless of the value of the page-buffer latch 151 as long as A2 of the page-buffer latch 152 is "0". Namely, the write buffer WB is set to indicate programming with respect to the memory cells that are subjected to Level0 and Level2 writing.

In order to perform programming on the relevant memory cells, BL_CNTRL is changed to HIGH to turn on the NMOS transistor 140, and PGMON is changed to HIGH to turn on the NMOS transistor 141, thereby supplying the LOW potential of the signal line AW of the write buffer WB to the bit line BLq.

In what follows, data writing with respect to Level1 will be described.

In this case, LOAD2 is turned to HIGH to make the NMOS transistor 138 conductive. If A1 of the page-buffer latch 151 is 0, B1 that is an inverse of A1 and thus "1" is stored in the BW side of the write buffer WB through the NMOS transistor 138. That is, the signal line AW of the write buffer WB becomes LOW. In this case, the signal line AW of the write buffer WB becomes LOW regardless of the value of the page-buffer latch 152 as long as A1 of the page-buffer latch 151 is "0". Namely, the write buffer WB is set to indicate programming with respect to the memory cells that are subjected to Level1 and Level2 writing.

In order to perform programming on the relevant memory cells, BL_CNTRL is changed to HIGH to turn on the NMOS transistor 140, and PGMON is changed to HIGH to turn on the NMOS transistor 141, thereby supplying the LOW potential of the signal line AW of the write buffer WB to the bit line BLq.

In the circuit of FIG. 9 as described above, the data of each memory cell stored in the page-buffer latches 151 and 152 remains even after the data of the write buffer WB is reset following a program operation. Accordingly, it is possible to transfer data from the page-buffer latches 151 and 152 to the write buffer WB even if the data has once been used in programming, which allows the procedure similar to the flowchart of FIG. 3 to be properly carried out.

When the gray code is used, the procedure for data writing according to the present invention is slightly different from the procedure of the flowchart shown in FIG. 3. In the flowchart of FIG. 3, Level0 and Level2 are programmed first, and, then, Level1 and Level2 are programmed, followed by programming Level2. In the case of the gray code, Level0 and Level1 are programmed first, and, then, Level1 and Level2 are programmed, followed by programming Level2.

Figure 11:
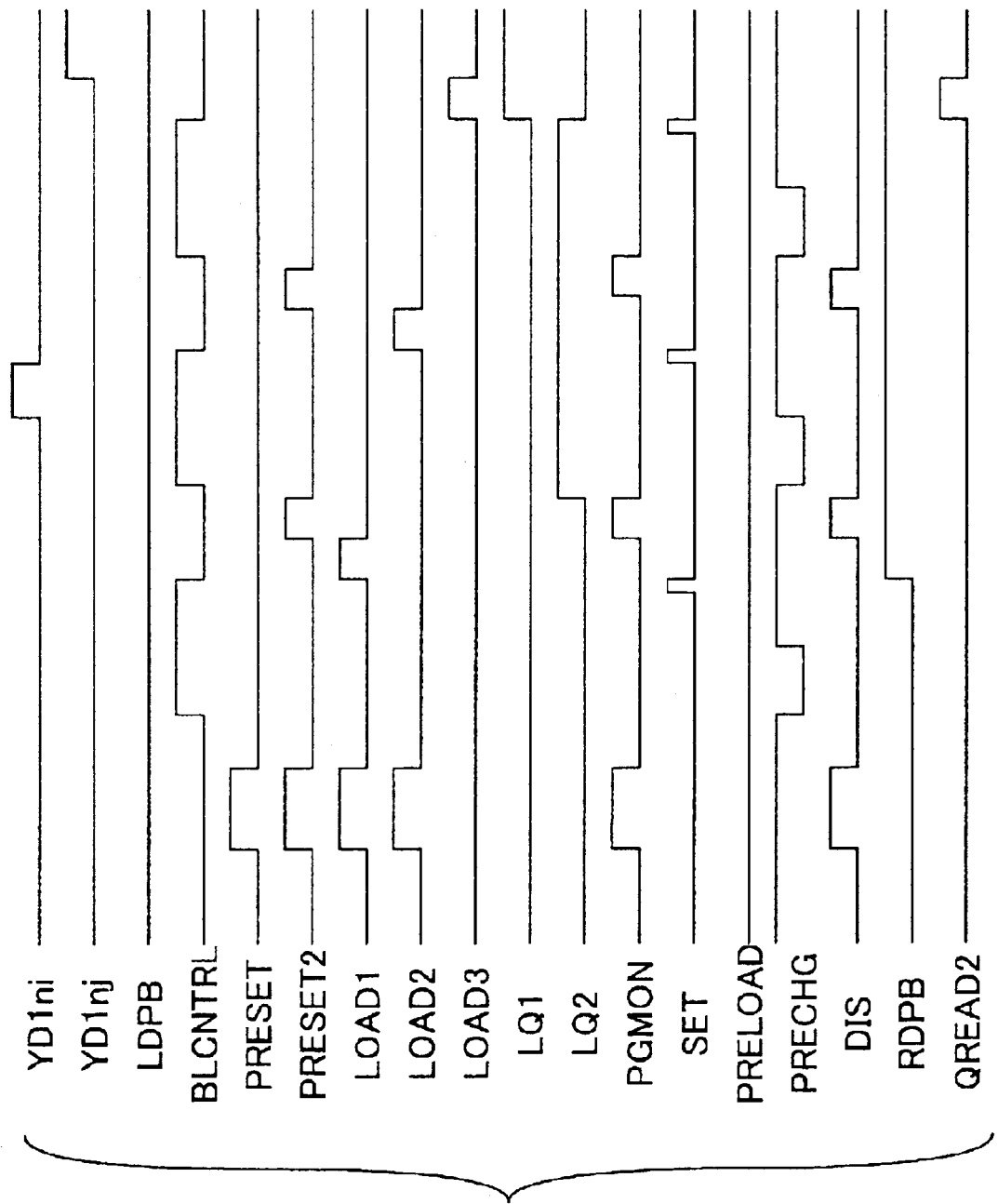
FIG. 11 is a timing chart showing the operation of data reading performed by the circuit of FIG. 9.

FIG. 11 is a timing chart showing the operation of data reading performed by the circuit of FIG. 9.

Controlling each signal according to the procedure shown in FIG. 11 achieves the reading of data from memory cells. In FIG. 11, sensed data are successively stored in the page-buffer latches 151 and 152 by successively reading data from memory cells through bit lines. The data stored in the page-buffer latches 151 and 152 in this manner represents 4-bit data levels, thereby achieving a proper read operation.

Further, the present invention is not limited to these embodiments, but various variations and modifications may be made without departing from the scope of the present invention.

What is claimed is:

1. A nonvolatile semiconductor memory device, comprising:

a memory core circuit which is nonvolatile and stores multi-values therein by setting different thresholds to memory cells; and a control circuit which controls data writing into said memory core circuit, wherein said control circuit programs first memory cells to be at one of the thresholds by setting said one of the thresholds not only to the first memory cells but also to second memory cells that are subsequently to be programmed to any one of the thresholds higher than said one of the thresholds, said control circuit successively performing programming in an ascending order of the thresholds.

2. The nonvolatile semiconductor memory device as claimed in claim 1, further comprising:

a page-buffer register which stores therein data to be written into memory cells; and a write buffer which stores therein said data for use in programming operation, said data being transferred from said page-buffer register to said write buffer at a time of programming, wherein said page-buffer register retains said data during the programming operation.

3. The nonvolatile semiconductor memory device as claimed in claim 2, further comprising a logic circuit which transfers said data from said page-buffer register to said write buffer, said logic circuit configured to transfer said data from said page-buffer register to said write buffer simultaneously with respect to two or more of said different thresholds.

4. The nonvolatile semiconductor memory device as claimed in claim 3, wherein said logic circuit determines whether to transfer given data from said page-buffer register to said write buffer according to bit state of a portion of said given data stored in said page-buffer register.

5. The nonvolatile semiconductor memory device as claimed in claim 1, wherein, in order to program given memory cells to be at a given threshold, said control circuit first programs said given memory cells by use of predetermined programming pulses and by use of a threshold lower than said given threshold for a verify purpose, and then programs said given memory cells by use of programming pulses weaker than said predetermined programming pulses and by use of said given threshold for a verify purpose.

6. A method of writing into a nonvolatile semiconductor memory device, comprising the steps of:

programming first memory cells to be at one of a plurality of thresholds by setting said one of the plurality of thresholds not only to the first memory cells but also to second memory cells that are subsequently to be programmed to any one of the thresholds higher than said one of the plurality of thresholds; and successively performing said programming in an ascending order of the thresholds.

7. The method as claimed in claim 6, further comprising the step of, in order to program given memory cells to be at a given threshold, programming said given memory cells by use of predetermined programming pulses and by use of a threshold lower than said given threshold for a verify purpose, followed by programming said given memory cells by use of programming pulses weaker than said predetermined programming pulses and by use of said given threshold for a verify purpose.

8. A nonvolatile semiconductor memory device, comprising:

a memory core circuit which includes nonvolatile memory cells; and a control circuit which controls data writing into said memory core circuit, wherein, in order to program given memory cells to be at a given threshold, said control circuit first programs said given memory cells by use of predetermined programming pulses and verifies said given memory cells by use of a threshold lower than said given threshold, and then programs said given memory cells by use of programming pulses weaker than said predetermined programming pulses and verifies said given memory cells by use of said given threshold.

9. A method of programming memory cells to be at a given threshold in a nonvolatile semiconductor memory device, comprising the steps of:

programming said memory cells by use of predetermined programming pulses and verifying said memory cells by use of a threshold lower than said given threshold; and programming said memory cells by use of programming pulses weaker than said predetermined programming pulses and verifying said memory cells by use of said given threshold.

* * * * *